United States Patent
Lee et al.

(10) Patent No.: US 9,293,362 B2
(45) Date of Patent: *Mar. 22, 2016

(54) SEMICONDUCTOR DEVICE INCLUDING AIR GAPS AND METHOD OF FABRICATING THE SAME

(71) Applicant: SK hynix Inc., Gyeonggi-do (KR)

(72) Inventors: Nam-Yeal Lee, Gyeonggi-do (KR);
Seung-Jin Yeom, Gyeonggi-do (KR);
Sung-Won Lim, Gyeonggi-do (KR);
Seung-Hee Hong, Gyeonggi-do (KR);
Hyo-Seok Lee, Gyeonggi-do (KR);
Dong-Seok Kim, Gyeonggi-do (KR);
Seung-Bum Kim, Gyeonggi-do (KR);
Sei-Jin Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/801,033

(22) Filed: Mar. 13, 2013

(65) Prior Publication Data

US 2014/0175659 A1    Jun. 26, 2014

(30) Foreign Application Priority Data

Dec. 26, 2012 (KR) .......................... 10-2012-0153806

(51) Int. Cl.
| | |
|---|---|
| *H01L 21/768* | (2006.01) |
| *H01L 23/48* | (2006.01) |
| *H01L 27/108* | (2006.01) |
| *H01L 21/764* | (2006.01) |
| *H01L 21/762* | (2006.01) |

(52) U.S. Cl.
CPC .......... *H01L 21/7682* (2013.01); *H01L 21/764* (2013.01); *H01L 21/76224* (2013.01); *H01L 21/76831* (2013.01); *H01L 21/76897* (2013.01); *H01L 23/48* (2013.01); *H01L 27/10855* (2013.01); *H01L 27/10885* (2013.01); *H01L 27/10888* (2013.01); *H01L 21/76847* (2013.01); *H01L 2924/0002* (2013.01)

(58) Field of Classification Search
CPC .............. H01L 21/764; H01L 21/7682; H01L 27/11521; H01L 23/5222; H01L 21/76897; H01L 21/76834; H01L 27/11507; H01L 21/76; H01L 27/1052
See application file for complete search history.

(56) References Cited

U.S. PATENT DOCUMENTS

| | | | | |
|---|---|---|---|---|
| 4,240,195 | A | * 12/1980 | Clemens et al. | 438/250 |
| 5,240,879 | A | * 8/1993 | De Bruin | 438/653 |
| 2002/0093035 | A1 * | 7/2002 | Jin et al. | 257/208 |
| 2003/0022526 | A1 * | 1/2003 | Vyvoda et al. | 438/788 |
| 2008/0199996 | A1 * | 8/2008 | Muralidhar et al. | 438/265 |
| 2008/0272490 | A1 * | 11/2008 | Kim et al. | 257/751 |
| 2010/0285662 | A1 * | 11/2010 | Kim et al. | 438/675 |
| 2013/0328199 | A1 * | 12/2013 | Yun et al. | 257/754 |

* cited by examiner

*Primary Examiner* — Howard Weiss
*Assistant Examiner* — Sue Tang
(74) *Attorney, Agent, or Firm* — IP & T Group LLP

(57) ABSTRACT

This technology provides a semiconductor device and a method of fabricating the same, which may reduce parasitic capacitance between adjacent conductive structures. The method of fabricating a semiconductor device may include forming a plurality of bit line structures over a substrate, forming contact holes between the bit line structures, forming sacrificial spacers over sidewalls of the contact holes, forming first plugs recessed into the respective contact holes, forming air gaps by removing the sacrificial spacers, forming capping structures capping the air gaps while exposing top surfaces of the first plugs, and forming second plugs over the first plugs.

14 Claims, 11 Drawing Sheets

SEMICONDUCTOR DEVICE INCLUDING AIR GAPS AND METHOD OF FABRICATING THE SAME

CROSS-REFERENCE TO RELATED APPLICATIONS

The present application claims priority of Korean Patent Application No. 10-2012-0153806, filed on Dec. 26, 2012, which is incorporated herein by reference in its entirety.

BACKGROUND

1. Field

Exemplary embodiments of the present invention relate to a semiconductor device, and more particularly, to a semiconductor device including air gaps and a method of fabricating the same.

2. Description of the Related Art

In general, a semiconductor device includes a second conductive structure formed between a plurality of first conductive structures, wherein an insulation layer is interposed between the second conductive structure and the first conductive structure. For example, the first conductive structures may include a gate, a bit line, a metal wire, etc., and the second conductive structures may include a contact plug, a storage node contact plug, a bit line contact plug, a via, etc.

As the degree of integration of semiconductor devices increased, an interval between the first conductive structure and the second conductive structure is gradually narrowed. For this reason, parasitic capacitance between the first conductive structure and the second conductive structure is increased. As the parasitic capacitance is increased, the operating speed of the semiconductor device is decreased and a refresh characteristic is deteriorated.

In order to reduce the parasitic capacitance, a method of lowering the dielectric constant of the insulation layer may be used. In semiconductor devices, an insulation layer is chiefly made of silicon oxide or silicon nitride. A silicon oxide layer has a dielectric constant of about 4, and a silicon nitride layer has a dielectric constant of about 7.

A reduction of parasitic capacitance is limited because a silicon oxide or a silicon nitride still has a high dielectric constant. A material having a relatively low dielectric constant has recently been developed, but the dielectric constant of the material may be not so low.

SUMMARY

Exemplary embodiments of the present invention are directed to providing a semiconductor device and a method of fabricating the same, which may reduce parasitic capacitance between adjacent conductive structures.

In accordance with an exemplary embodiment of the present invention, a method of fabricating a semiconductor device includes forming a plurality of bit line structures over a substrate; forming contact holes between the bit line structures; forming sacrificial spacers over sidewalls of the contact holes, forming first plugs recessed into the respective contact holes, forming air gaps by removing the sacrificial spacers, forming capping structures capping the air gaps while exposing top surfaces of the first plugs, and forming second plugs over the first plugs.

In accordance with another exemplary embodiment of the present invention, a method of fabricating a semiconductor device includes forming a plurality of bit line structures over a substrate; forming contact holes between the bit line structures; forming sacrificial spacers on sidewalls of the contact holes; forming silicon plugs recessed into the respective contact holes; forming air gaps by removing the sacrificial spacers; forming capping structures capping the air gaps while exposing top surfaces of the silicon plugs; forming ohmic contact layers over the silicon plugs; and forming metal plugs over the ohmic contact layers.

In accordance with still another exemplary embodiment of the present invention, a semiconductor device includes a plurality of bit line structures formed over a substrate; storage node contact holes formed to have sidewalls of the bit line structures exposed therethrough; silicon plugs recessed and formed in the respective storage node contact holes; air gaps formed between the sidewalls of the bit line structures and the silicon plugs; capping layer patterns formed over the air gaps; passivation layers formed over the respective capping layer patterns; and metal plugs formed over the respective silicon plugs, wherein the air gaps are capped with the respective capping layer patterns and passivation layers.

DETAILED DESCRIPTION

Figure 1:
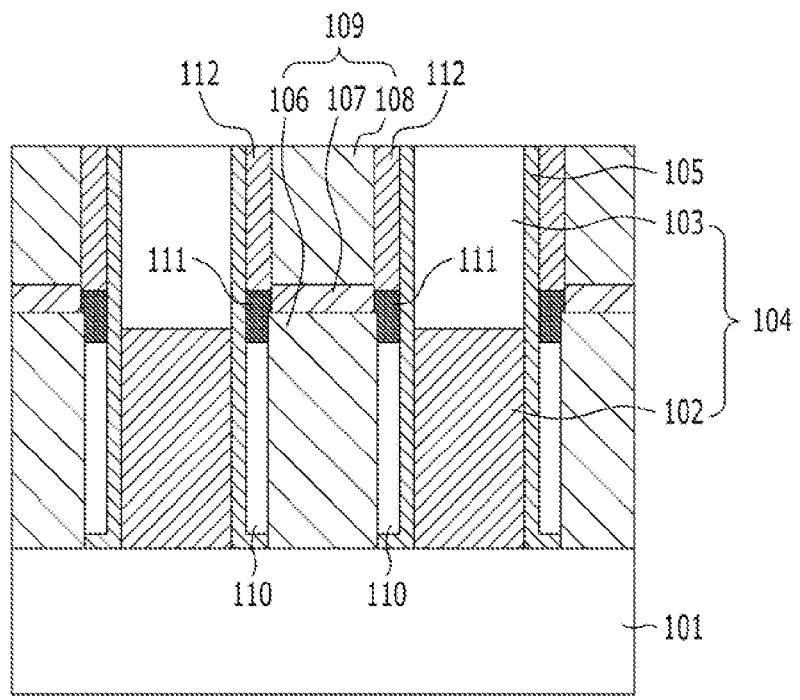
FIG. 1 is a cross sectional view illustrating a portion of a semiconductor device in accordance with an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

FIG. 1 is a cross sectional view illustrating a portion of a semiconductor device in accordance with an embodiment of the present invention.

Referring to FIG. 1, semiconductor structures are formed over a substrate 101. The semiconductor structure may include a plurality of conductive structures. The conductive structures may include first conductive structures 104 and second conductive structures 109. An air gap 110 may be formed between the first conductive structure 104 and the second conductive structure 109. A capping layer 111 and a passivation layer 112 may be formed over the air gap 110.

Each of the first conductive structures 104 may include a first conductive layer 102. The first conductive structure 104 may have a stack structure including the first conductive layer 102 and a hard mask layer 103. The first conductive layer 102 may include a silicon-containing layer or a metal-containing layer. The first conductive layer 102 may be formed by stacking the silicon-containing layer and the metal-containing layer. The first conductive layer 102 may include polysilicon, metal, metal nitride, metal silicide, or the like. The first conductive layer 102 may be formed by stacking a polysilicon layer and a metal layer. The metal layer may include tungsten (W). The hard mask layer 103 may include an insulating material. The hard mask layer 103 may include oxide or nitride. One of the first conductive structure 104 and the second conductive structure 109 may have a line type in which the conductive structure extends in one direction. The other of the first conductive structure 104 and the second conductive structure 109 may have a plug type. For example, the first conductive structure 104 may be a structure having a line type, and the second conductive structure 109 may be a structure having a plug type. The first conductive structures 104 may be regularly arranged on the substrate 101 at regular intervals.

The second conductive structure 109 may include a second conductive layer 106 recessed between the first conductive structures 104. Each of the second conductive structures 109 may have a stack structure including the second conductive layer 106, an ohmic contact layer 107, and a third conductive layer 108. The second conductive layer 106 may include a silicon-containing layer. The second conductive layer 106 may include a polysilicon layer. The third conductive layer 108 may include a metal-containing layer. The ohmic contact layer 107 may include metal silicide, such as cobalt silicide. The third conductive layer 108 may include metal, metal silicide, metal nitride, or the like. The third conductive layer 108 may have a stack structure including a barrier layer and a metal layer. The barrier layer may include metal nitride. The third conductive layer 108 may include a material including titanium (Ti) or tungsten (W) as main ingredients.

The capping layer 11 may be of a type that caps the air gap 110. The capping layer 111 may include the oxide of the second conductive layer 106. In particular, the capping layer 111 may include the plasma oxide of the second conductive layer 106. The capping layer 111 may include silicon oxide.

Spacers 105 may be formed over both sidewalls of the first conductive structure 104. The spacers 105 may include an insulating material. The spacers 105 may include oxide or nitride. The spacers 105 together with the air gap 110, may function to insulate the first conductive structures 104 from the second conductive structures 109.

One of the first conductive structure 104 and the second conductive structure 109 may include a gate and a bit line, and the other of the first conductive structure 104 and the second conductive structure 109 may include a contact plug. The contact plug may include a storage node contact plug, a landing plug, etc. In FIG. 1, the first conductive layer 102 of the first conductive structure 104 may include a bit line, and the second conductive structure 109 may include a storage node contact plug. Accordingly, the air gap 110 in may be formed between the bit line and the storage node contact plug. The storage node contact plug may have a structure including the second conductive layer 106, the ohmic contact layer 107, and the third conductive layer 108. The second conductive layer 106 may become a first plug, the third conductive layer 108 may become a second plug, and the ohmic contact layer 107 is formed between the first plug and the second plug. Since the first plug includes a silicon-containing layer and the second plug includes a metal-containing layer, the storage node contact plug may have a stack structure including the silicon-containing plug and the metal-containing plug.

As shown in FIG. 1, the air gap 110 is formed between the first conductive structure 104 and the second conductive structure 109. The air gap 110 has a dielectric constant of 1 and reduces parasitic capacitance between the first conductive structure 104 and the second conductive structure 109. Furthermore, the top of the air gap 110 is sealed by the capping layer 111.

The capping layer 111 for capping the air gap 110 is made of oxide generated by oxidizing the second conductive layer 106. The passivation layer 112 is formed over the capping layer 111. Accordingly, the air gap 110 may be stably capped. The passivation layer 112 may include silicon nitride. The passivation layer 112 is formed over the capping layer 111 and may be formed over the sidewalls of the ohmic contact layer 107 and the third conductive layer 108.

FIGS. 2A to 2K show cross-sectional views showing a method of forming a semiconductor device in accordance with an embodiment of the present invention.

Figure 2A:
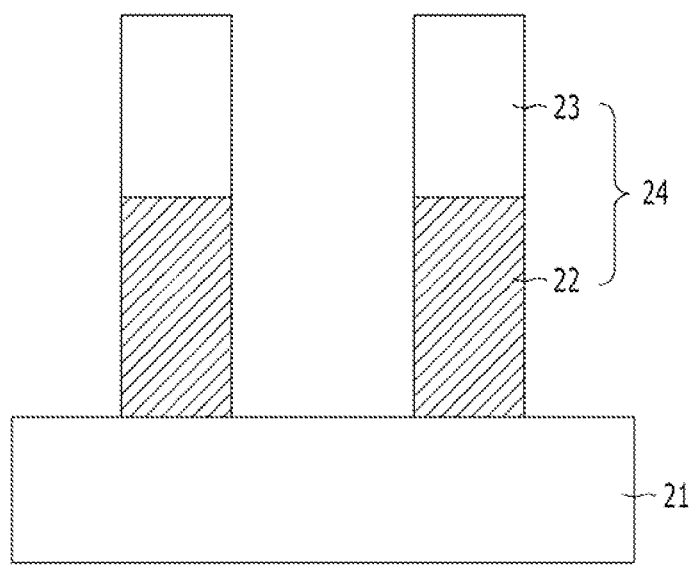
FIGS. 2A to 2K show cross-sectional views showing a method of forming a semiconductor device in accordance with an embodiment of the present invention.
Figure 2B:
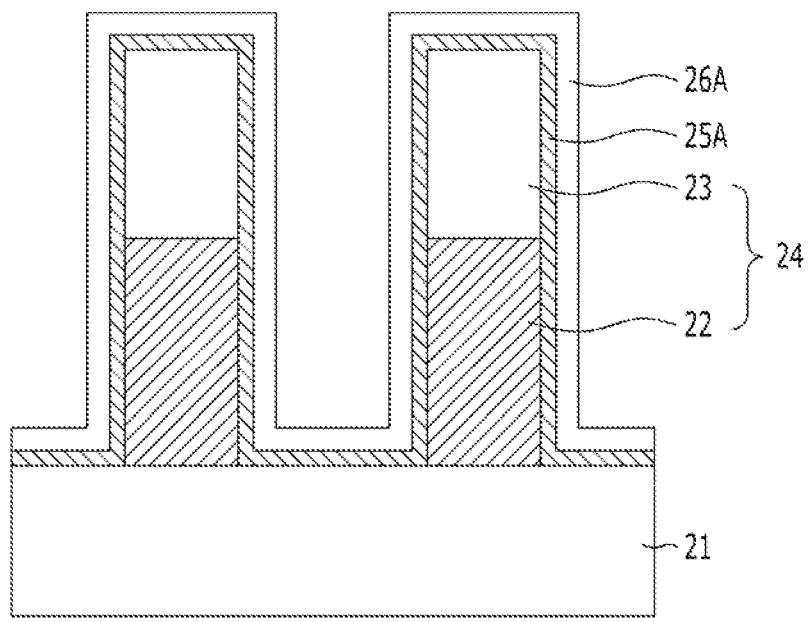

As shown in FIG. 2A, a plurality of first conductive structures 24 is formed over a substrate 21. The substrate 21 may contain silicon (Si). The substrate 21 may include a Si or a silicon germanium (SiGe) substrate. Furthermore, the substrate 21 may include a silicon on insulator (501) substrate.

The first conductive structures 24 formed over the substrate 21 may have a line type in which the first conductive structures 24 are regularly arranged at regular intervals. Each of the first conductive structures 24 includes a first conductive layer pattern 22 and a hard mask pattern 23. The method for forming the first conductive structures 24 is described as follows. First, a first conductive layer (not shown) is formed over the substrate 21, and the hard mask pattern 23 is formed over the first conductive layer. Then, the first conductive layer patterns 22 are formed by etching the first conductive layer by using the hard mask pattern 23 as an etch mask. The first conductive structures 24 in each of which the first conductive layer pattern 22 and the hard mask pattern 23 are stacked are formed. Each of the first conductive layer patterns 22 may include a silicon-containing layer and/or a metal-containing layer. For example, the first conductive layer pattern 22 may include a polysilicon layer or a tungsten layer. Furthermore, the first conductive layer pattern 22 may be formed by stacking the polysilicon layer and the metal layer. In this case, a barrier layer may be further formed between the polysilicon layer and the metal layer. The first conductive layer patterns 22 may have a stack structure including a polysilicon layer, a titanium-containing layer, or a tungsten layer. The titanium-containing layer is the barrier layer and may be formed by stacking a Ti layer and a titanium nitride layer.

As shown in FIG. 28, an insulation layer 25A is formed over the entire surface including the first conductive structures 24. The insulation layer 25A may include nitride or oxide. The insulation layer 25A may include silicon nitride and/or silicon oxide. The Insulation layer 25A includes a material that becomes a spacer.

A sacrificial layer 26A is formed over the insulation layer 25A. The sacrificial layer 26A includes a material that is removed in a subsequent process and that forms an air gap. The sacrificial layer 26A includes a material having an etch selectivity to the insulation layer 25A. The sacrificial layer 26A may include oxide, nitride, or metal nitride. If the insulation layer 25A includes oxide, the sacrificial layer 26A may include metal nitride or nitride. If the insulation layer 25A includes nitride, the sacrificial layer 26A may include oxide or metal nitride. The sacrificial layer 26A may include silicon oxide, silicon nitride, or titanium nitride (TiN).

Figure 2C:
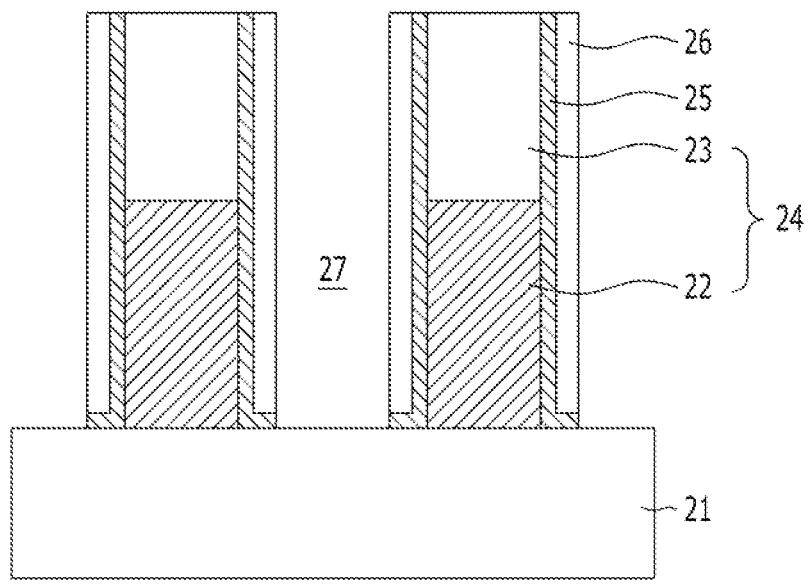

As shown in FIG. 2C, dual spacers are formed over both sidewalls of the first conductive structure 24. The dual spacers include a spacer 25 and a sacrificial spacer 26. The spacer 25 is formed by etching the insulation layer 25A. The sacrificial spacer 26 is formed over the sidewall of the spacer 25. The sacrificial spacer 26 may be formed by etching the sacrificial layer 26A. In order to form the spacer 25 and the sacrificial spacer 26, an etch-back process may be performed.

An open part 27 through which the substrate 21 is exposed is formed between the first conductive structures 24 because the spacers 25 and the sacrificial spacers 26 are formed as described above. After forming the spacers 25, an interlayer insulation layer (not shown) may be formed and the open parts 27 may be formed by etching the interlayer insulation layer. After forming the open parts 27, the sacrificial spacers 26 may be formed over the sidewalls of the open parts 27.

The open part 27 may be formed while the side alts of the sacrificial spacers 26 are exposed to the open part 27. The open part 27 may have a line type or a contact hole type. For example, if the first conductive structure 24 includes a bit line structure, the open part 27 may include a storage node contact hole.

Figure 2D:
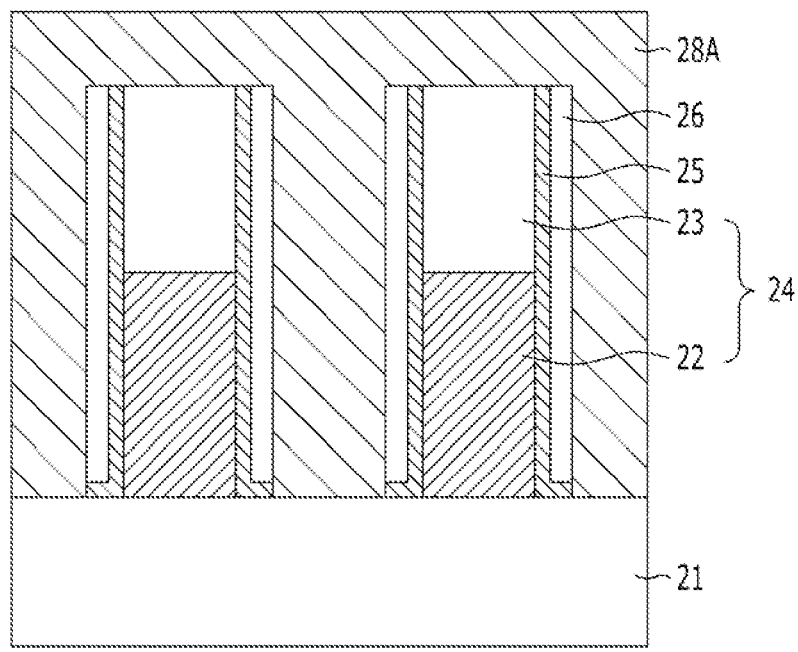

As shown in FIG. 2D, a second conductive layer 28A for gap-filling the open parts 27 is formed. The second conductive layer 28A may include a silicon-containing layer. The second conductive layer 28A may include a polysilicon layer.

Figure 2E:
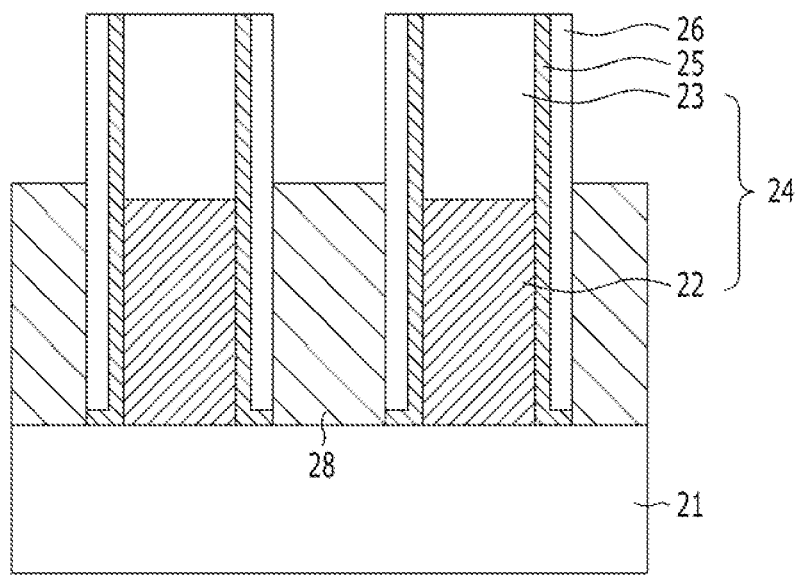

As shown in FIG. 2E, the second conductive layer 28A is selectively removed. Accordingly, a second conductive layer pattern 28 is recessed between the first conductive structures 24. In order to form the second conductive layer patterns 28, an etch-back process may be performed. The second conductive layer pattern 28 has a surface that has been recessed lower than a surface of the first conductive structure 24. The recessed surface of the second conductive layer pattern 28 may be controlled so that it is higher than at least the top surface of the first conductive layer pattern 22. The second conductive layer pattern 28 may have a height that may minimize an area where the second conductive layer pattern 28 faces the first conductive layer pattern 22. Thus, parasitic capacitance between the first conductive layer pattern 22 and the second conductive layer pattern 28 may be reduced. The second conductive layer patterns 28 may become contact plugs. If the first conductive structure 24 includes a bit line structure, the second conductive layer pattern 28 may become a part of a storage node contact plug. When forming the second conductive layer patterns 28, the spacers 25 and the sacrificial spacers 26 are not etched owing to selectivity.

Figure 2F:
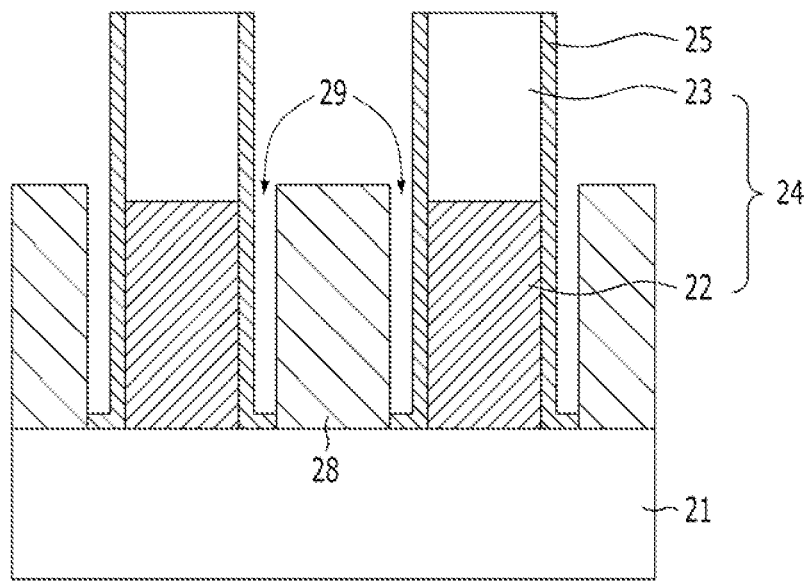

As shown in FIG. 2F, the sacrificial spacers 26 are selectively removed. Accordingly, air gaps 29 are formed. The air gaps 29 may be formed over the sidewalls of the second conductive layer patterns 28. The air gap 29 is formed between the second conductive layer pattern 28 and the first conductive layer pattern 22. The insulating structure of the 'air gap 29-spacer 25' is formed between the first conductive layer pattern 22 and the second conductive layer pattern 28.

In order to remove the sacrificial spacers 26 wet etch or dry etch may be performed. When removing the sacrificial spacers 26, the spacers 25, the second conductive layer patterns 28, and the hard mask patterns 23 are not damaged owing to selectivity. If the sacrificial spacers 26 are made of titanium nitride, wet cleaning using a mixed solution of $H_2SO_4$ and $H_2O_2$ may be performed.

When the air gaps 29 are formed as described above, parasitic capacitance between the first conductive layer pattern 22 and the second conductive layer pattern 28 is reduced.

Figure 2G:
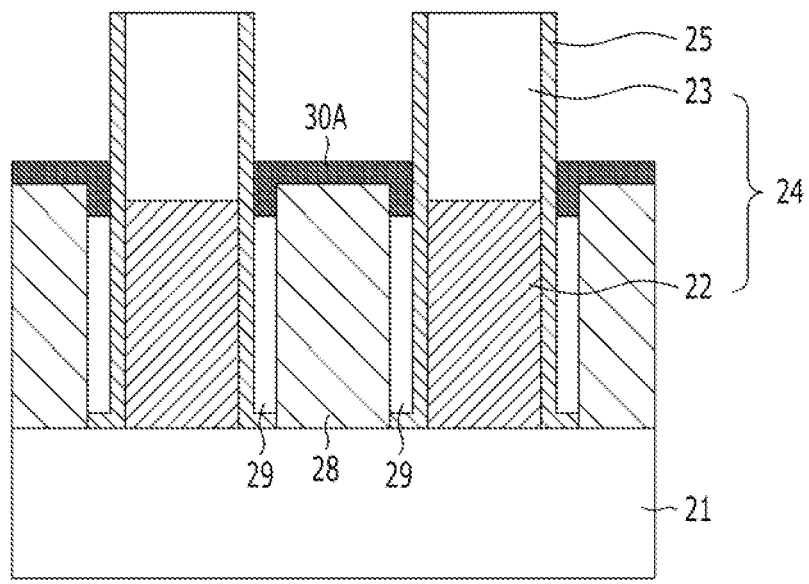

As shown in FIG. 2G, capping layers 30A are formed over the top surfaces and sidewalls of the second conductive layer patterns 28. The capping layer 30A may include an insulating material. The capping layer 30A may include the oxide of the second conductive layer pattern 28. The capping layer 30A may include silicon oxide. The capping layer 30A may be formed by an oxidization process. Since the second conductive layer pattern 28 includes a silicon-containing layer, silicon oxide may be formed over the top surfaces and sidewalls of the second conductive layer patterns 28 by way of the oxidization process. The capping layer 30A may be formed to a thickness that does not gap-fill the air gap 29. The capping layer 30A may be formed by a plasma oxidization method. In this case, the capping layer 30A is formed to a thin thickness that does not gap-fill the air gap 29. If the capping layer 30A is formed by the plasma oxidization method, the capping layer 30A is oxidized on the top surface of the second conductive layer pattern 28 and at the same time the capping layer 30A is rapidly oxidized at the top corners of the second conductive layer pattern 28. That is, the capping layer 30A formed over the top corners of the second conductive layer pattern 28 has a thickness greater than that of the capping layer 30A formed over the top surface of the second conductive layer pattern 28. Accordingly, since oxidization is rarely generated on the sidewalls of the second conductive layer pattern 28, the capping layer 30A that covers the second conductive layer pattern 28 may be selectively formed.

When the capping layers 30A are formed, the air gaps 29 may be prevented from being open in a subsequent process.

Figure 2H:
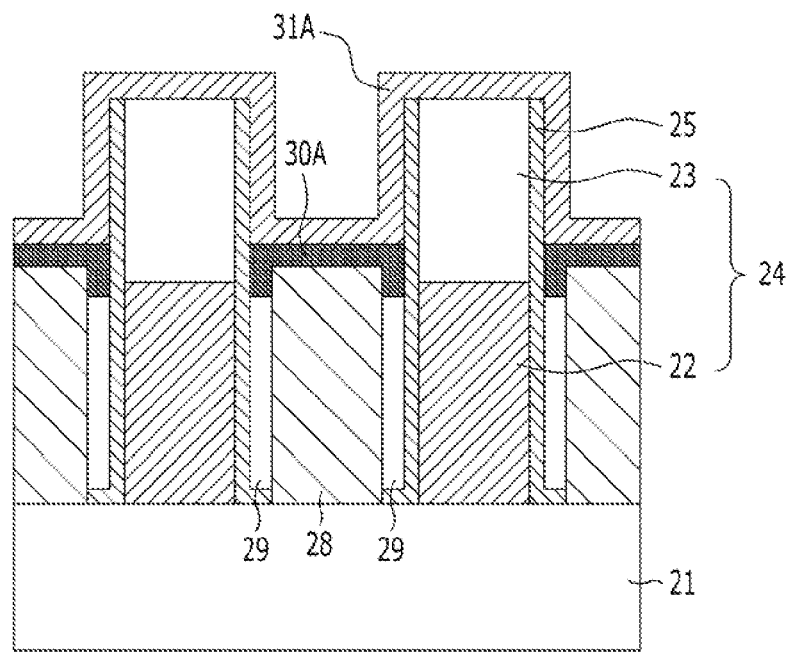

As shown in FIG. 2H, a spacer material 31A is formed over the entire surface in which the capping layers 30A are formed. The spacer material 31A may include an insulating material. The spacer material 31A may include silicon nitride. Silicon nitride may be formed by a low pressure chemical vapor deposition (LPCVD) method or a plasma-enhanced chemical vapor deposition (PECVD) method.

Figure 2I:
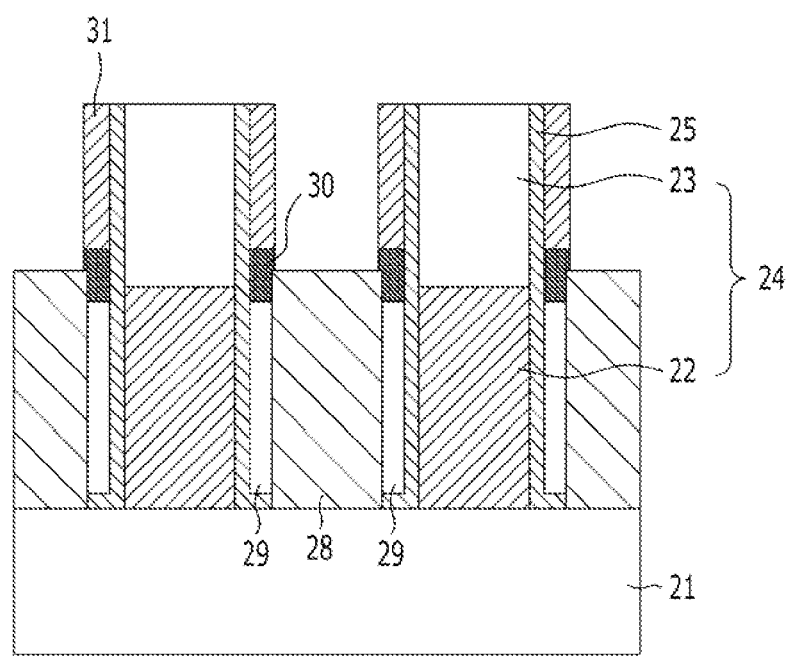

As shown in FIG. 2I, the spacer material 31A is selectively removed. Accordingly, passivation layers 31, each having a spacer type, are formed. After forming the passivation layers 31, the capping layers 30A may be selectively etched so that the second conductive layer patterns 28 are exposed. As a result, capping layer patterns 30, which expose the top surfaces of the second conductive layer patterns 28 and cap the air gaps 29, and the passivation layers 31, which cover the upper sides and sidewalls of the open parts over the capping layer patterns 30, are formed. When etching the spacer material, the air gaps 29 may be prevented from being opened because the capping layer patterns 30 function as etch barriers.

In another embodiment, after forming the capping layers 30A, the capping layers 30A may be selectively etched so as to form the capping layer patterns 30 which expose the top surfaces of the second conductive layer patterns 28 and cap the air gaps 29. Then, after forming the spacer material 31A, the spacer material 31A is selectively removed so as to form the passivation layers 31 which cover the upper sides and sidewalls of the open parts over the capping layer patterns 30. Accordingly, when etching the spacer material, the air gaps 29 may be prevented from being opened because the capping layer patterns 30 function as etch barriers.

Although not shown, voids generated within the first conductive layer patterns 28 may be removed by performing rapid thermal annealing (RTA) after forming the passivation layers 31. Furthermore, after the RTA, ion implantation may be performed as a subsequent process. The ion implantation is performed in order to improve contact resistance.

Figure 2J:
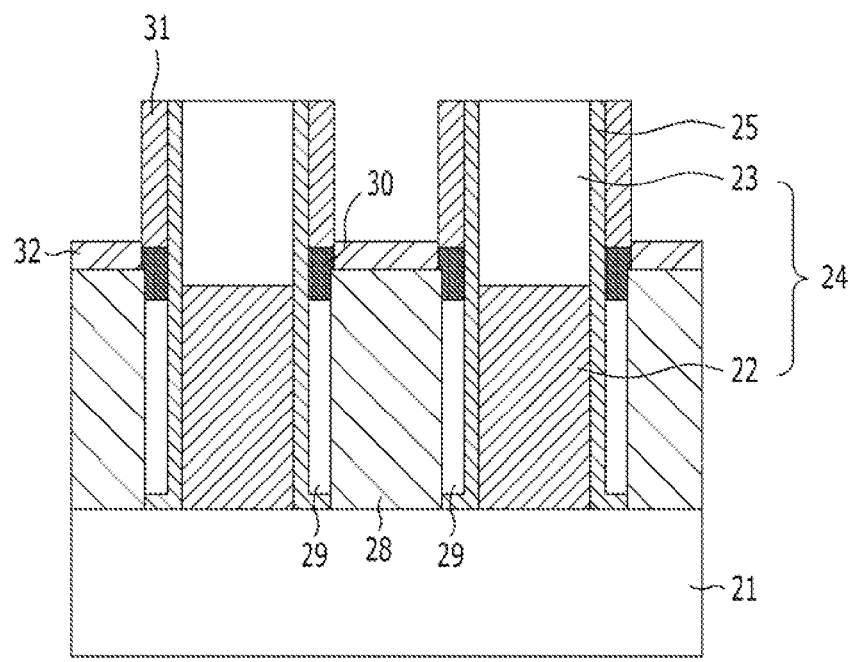

As shown in FIG. 2J, ohmic contact layers 32 are formed over the second conductive layer patterns 28, respectively. The ohmic contact layer 32 may include metal silicide. In order to form metal silicide, annealing may be performed after forming a metal layer (not shown) on the entire surface. The metal layer may include a material that may be silicidized. The metal layer may include cobalt (Co). Metal silicide may be formed because the metal layer reacts to the silicon of the second conductive layer pattern 28 by way of the annealing. The metal silicide may include cobalt silicide. In the present embodiment, the metal silicide may include cobalt silicide having a 'CoSi$_2$ phase'.

Since cobalt silicide having a CoSi$_2$ phase is formed as the ohmic contact layer 32, contact resistance may be improved and cobalt silicide having sufficient low resistance even in the small area of the open part 27 having a fine line width may also be formed.

Next, a non-reacted metal layer is stripped. If the non-reacted metal layer is not removed, the metal atoms of the non-reacted metal layer may be diffused downward or the metal atoms of the non-reacted metal layer may generate an abnormal reaction with a metal silicide layer 32 in a subsequent process. For this reason, the non-reacted metal layer is removed. The non-reacted metal layer may be removed by a cleaning process using wet chemicals. For example, if the non-reacted metal layer is cobalt (Co) the non-reacted metal layer may be removed by $H_2SO_4$ (SPM) and $NH_4OH$(SC-1)-series chemicals. Incidentally, the non-reacted metal layer may be oxidized using deionized (DI) water and may be primarily removed using $H_2SO_4$ (SPM), and metallic polymer-series residues may be secondarily removed using $NH_4OH$-series chemicals.

If the wet chemicals are used as described above, both the non-reacted metal layer and metallic polymer may be removed cleanly.

Meanwhile, in order to form cobalt silicide, RTA may be performed at least twice. For example, primary annealing and secondary annealing may be performed. The primary annealing may be performed in a temperature of 400~600° C. and the secondary annealing may be performed in a temperature of 600~800° C. Cobalt silicide having a 'CoSi$_x$ (x=0.1~1.5) phase' is formed by the primary annealing. The cobalt silicide having a 'CoSi$_x$ (x=0.1~1.5)' phase is changed into cobalt silicide having a 'CoSi$_2$ phase' by way of the secondary annealing. From among cobalt silicides, cobalt silicide having a 'CoSi$_2$ phase' has the lowest resistivity. Non-reacted cobalt is removed between the primary annealing and the secondary annealing. The non-reacted cobalt may be removed using mixed chemicals of sulfuric acid ($H_2SO_4$) and hydrogen peroxide ($H_2O_2$).

Figure 2K:
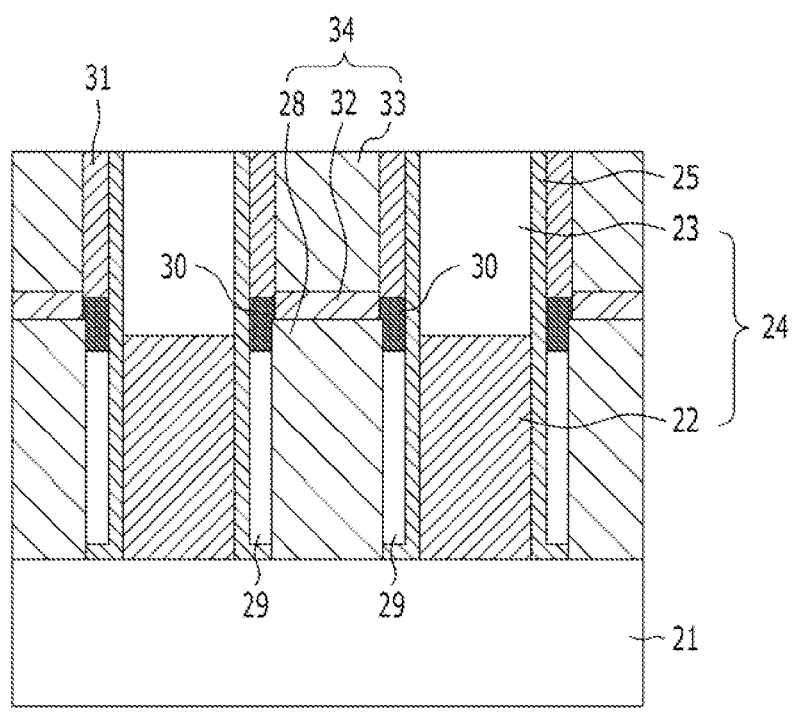

As shown in FIG. 2K, third conductive layer patterns 33 are formed over the ohmic contact layers 32. In order to form the third conductive layer patterns 33, a polishing process may be performed after forming a third conductive layer that gap-fills the top surfaces of the ohmic contact layers 32. The third conductive layer pattern 33 may include a metal-containing layer. The third conductive layer pattern 33 may include a tungsten layer. Although not shown, the third conductive layer pattern 33 may further include a barrier layer. Accordingly, the third conductive layer pattern 33 may be formed by stacking the barrier layer and the metal-containing layer. The barrier layer may include a material containing titanium (Ti). The barrier layer may be made of titanium (Ti) solely or may be formed by stacking titanium (Ti) and titanium nitride (TiN). If the third conductive layer pattern 33 includes a material that does not react to the second conductive layer pattern 28, the barrier layer may be omitted.

If the third conductive layer patterns 33 are formed as described above, second conductive structures 34 each including the second conductive layer pattern 28, the ohmic contact layer 32, and the third conductive layer pattern 33 are formed. The air gap 29 is formed between the first conductive structure 24 and the second conductive structure 34. The second conductive structure 34 may become a storage node contact plug. The second conductive layer pattern 28 may become the bottom plug of the storage node contact plug, and the third conductive layer pattern 33 may become the top plug of the storage node contact plug. Since the second conductive layer pattern 28 includes the silicon-containing layer and the third conductive layer pattern 33 includes the metal-containing layer, a contact plug including the silicon-containing layer and the metal-containing layer, that is, a semi-metal contact plug structure, may be formed.

The air gap 29 may be formed between the first conductive layer pattern 22 and the second conductive layer pattern 28. If the first conductive layer pattern 22 includes a bit line and the second conductive layer pattern 28 includes a storage node contact plug, the air gap 29 may be formed between the bit line and the storage node contact plug. If the first conductive layer pattern 22 includes a gate electrode and the second conductive layer pattern 28 includes a contact plug, the air gap 29 may be formed between the gate electrode and the contact plug.

Figure 3A:
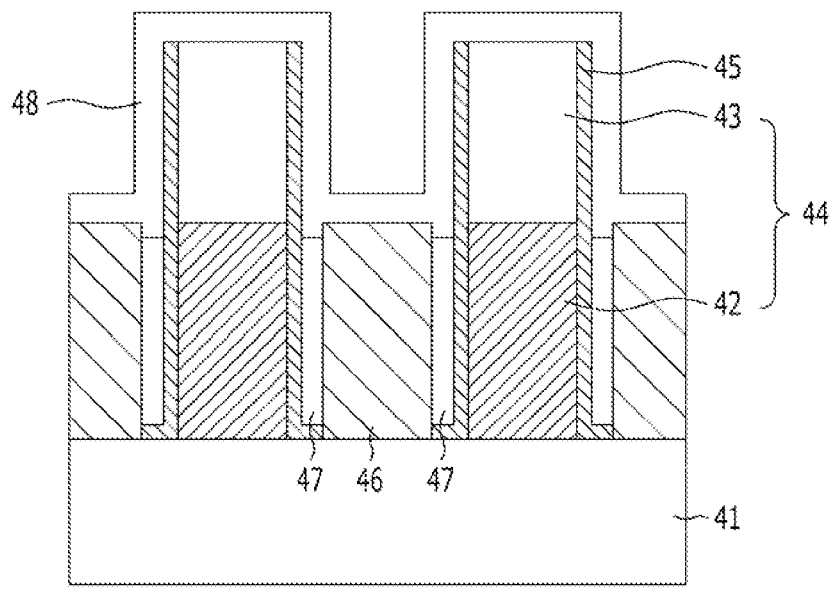
FIGS. 3A and 3B illustrate comparative examples that are compared with embodiments of the present embodiment.
Figure 3B:
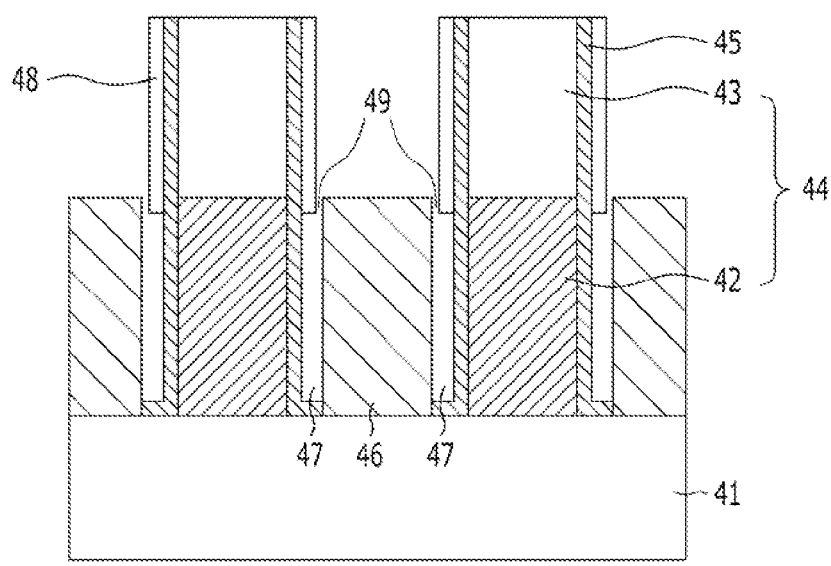

FIGS. 3A and 3B illustrate comparative examples that are compared with the present embodiment.

Referring to FIGS. 3A and 3B, a plurality of first conductive structures 44 in each of which a first conductive layer 42 and a hard mask layer 43 are stacked is formed over a substrate 41, and a second conductive layer 46 that forms a second conductive structure is formed between the first conductive structures 44. An air gap 47 is formed between the first conductive structure 44 and the second conductive layer 46. Spacers 45 are formed over the sidewalls of the first conductive structure 44.

In the comparison examples, a single insulating material may be used as a capping layer 48. The capping layer 48 may include silicon nitride or silicon oxide. When an insulating material is used as the capping layer 48, the capping layer 48 has to be selectively removed from a surface of the second conductive layer 46 for a subsequent process.

If the capping layer 48 is attacked by a subsequent process, however, a self-alignment contact (SAC) fail is generated. If the capping layer 48 is thickly formed in order to form stable air gaps 47, contact resistance may be greatly increased because an area where metal silicide is formed may be greatly reduced.

In particular, if the capping layer 48 is solely formed there is a problem in that the air gaps 47 are opened because the capping layer 48 is attached when etching the capping layer 48 in order to form metal silicide by opening the top surfaces of the second conductive layers 46 (refer to reference numeral 49).

As a result, as in the present embodiment, when the air gap 29 is capped with the dual structure of the capping layer pattern 30 and the passivation layer 31 using silicon nitride by way of a plasma oxidization process, a top-open margin may be secured and the air gap may also be sufficiently capped.

Figure 4A:
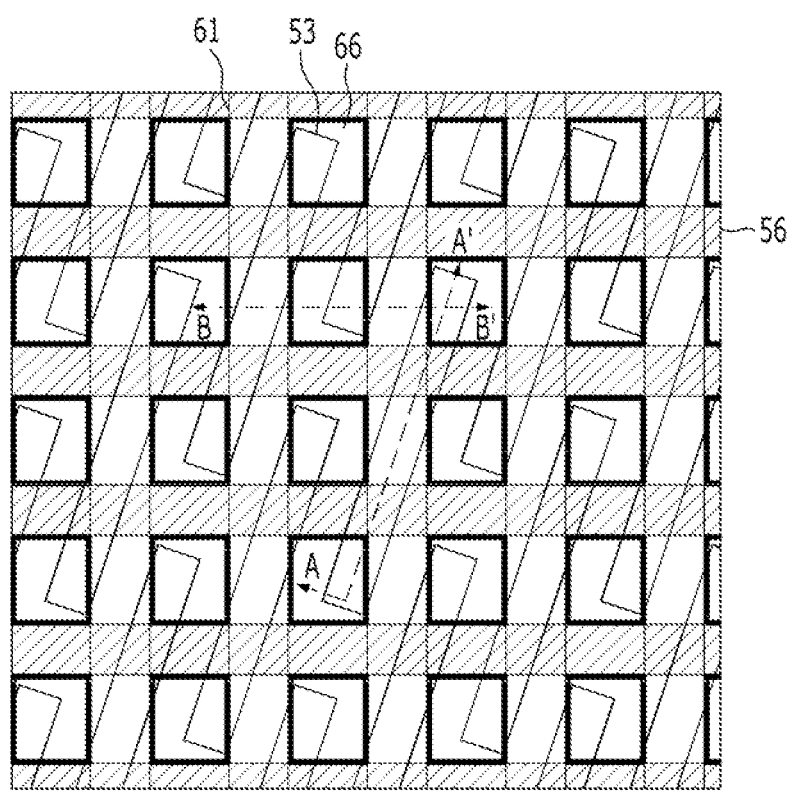
FIG. 4A shows memory cells of DRAM.
Figure 4B:
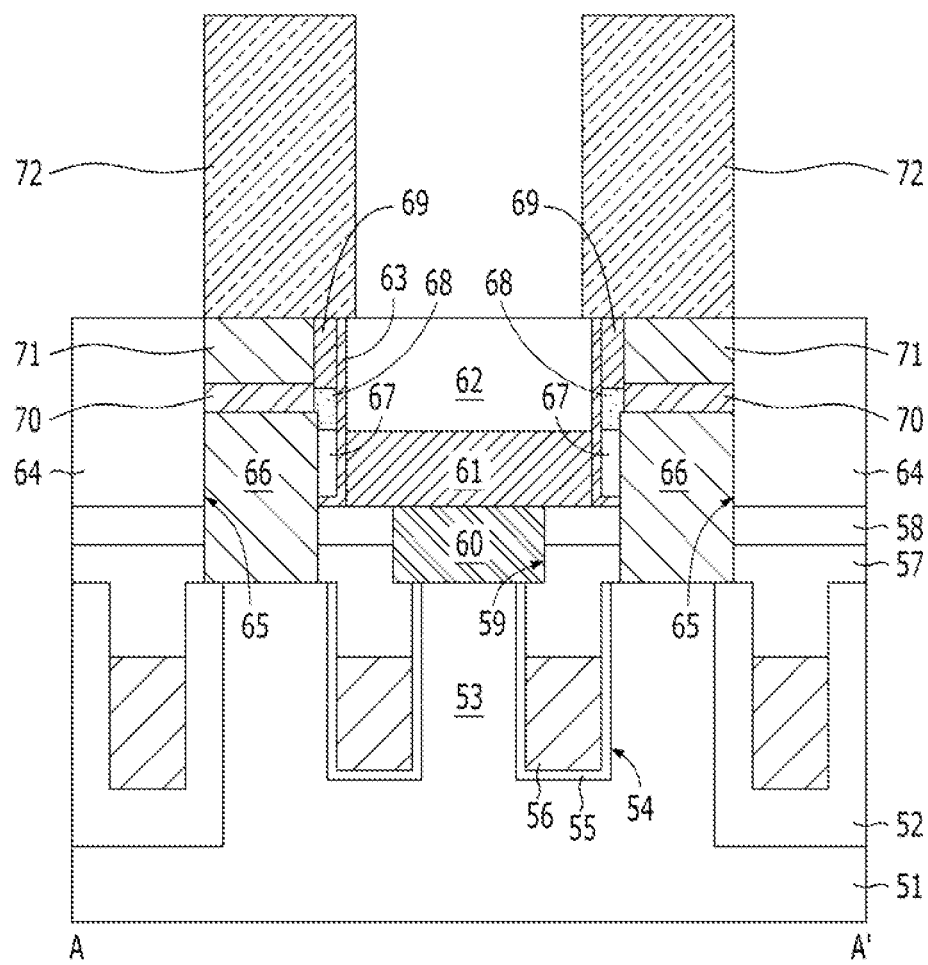
FIG. 4B is a cross-sectional view of the DRAM taken along line A-A' of FIG. 4A.
Figure 4C:
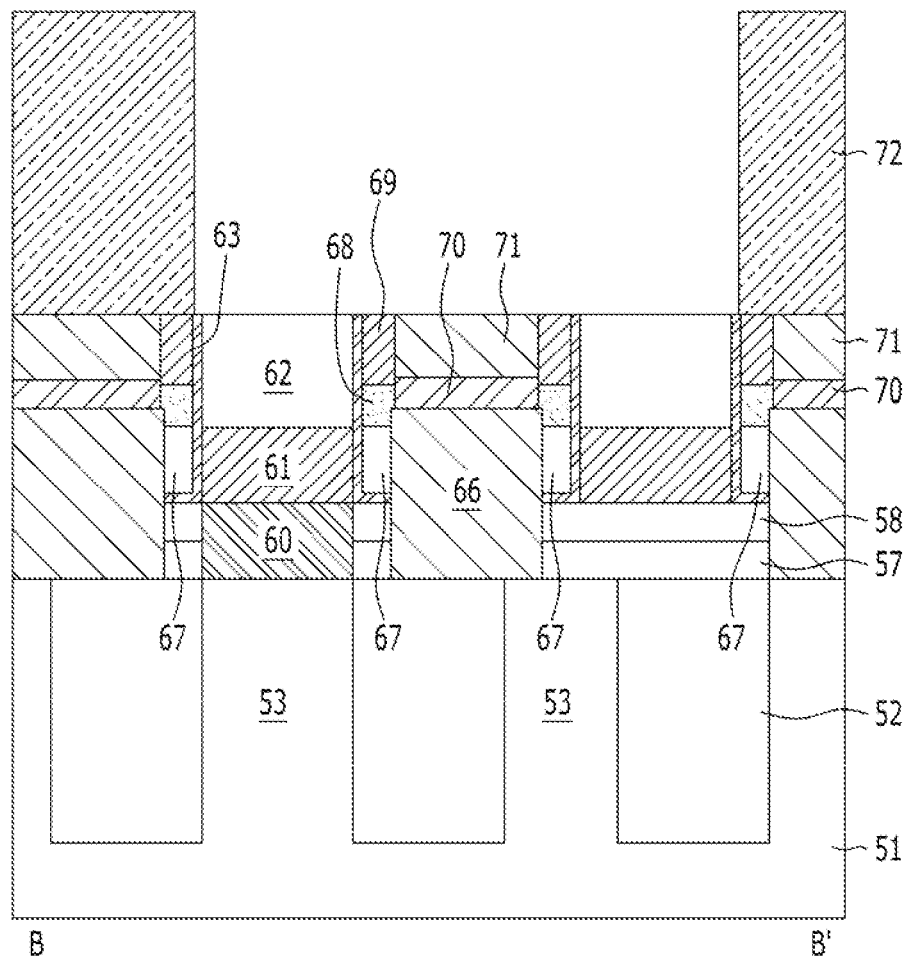
FIG. 4C is a cross-sectional view of the DRAM taken along line B-B' of FIG. 4A.

FIG. 4A shows memory cells of DRAM, FIG. 4B is a cross-sectional view of the DRAM taken along line A-A' of FIG. 4A, and FIG. 4C is a cross-sectional view of the DRAM taken along line B-B' of FIG. 4A.

Referring to FIGS. 4A, 4B, and 4C, active regions 53 are defined in a substrate 51 by way of isolation regions 52. Burial gate electrodes 56 are formed in respective trenches 54 that cross the active regions 53 and the isolation regions 52. Bit lines 61 extended in a direction to cross the burial gate electrodes 56 are formed over the substrate 51, and the bit lines 61 are connected to the active regions 53 through respective bit line contact plugs 60. Storage node contact plugs connected to the respective active regions 53 are formed. Each of the storage node contact plugs may be formed by stacking a first plug 66, an ohmic contact layer 70, and a second plug 71. The storage node 72 of a capacitor is formed over each of the second plugs 71 of the storage node contact plugs.

The storage node contact plug may correspond to the second conductive structure according to the present embodiments, and the bit line may correspond to the first conductive layer pattern of the first conductive structure according to the present embodiments. Accordingly, the air gap 67 may be formed between the storage node contact plug and the bit line 61. The storage node contact plug may include the first plug 66 and the second plug 71 and may further include the ohmic contact layer 70 formed between the first plug 66 and the second plug 71. The ohmic contact layer 70 may include metal silicide, such as cobalt silicide.

The air gap 67 is capped with a capping layer 68, and a passivation layer 69 is formed over the capping layer 68. The capping layer 68 and the passivation layer 69 may correspond to the capping layer according to the present embodiments. Accordingly, the capping layer 68 may include silicon oxide, and the passivation layer 69 may include silicon nitride.

A method of fabricating the memory cells is described below with reference to FIGS. 4A, 4B, and 4C.

The substrate 51 includes a semiconductor material. The substrate 51 may include a semiconductor substrate. The substrate 51 may include a silicon substrate and may include, for example, a single crystalline silicon substrate. The isolation regions 52 may be formed by a shallow trench isolation (STI) process. The active regions 53 are defined by the isolation regions 52. The isolation regions 52 may be formed by sequentially stacking wall oxide, a liner, and a gap-fill material. The liner may include silicon nitride and silicon oxide. The silicon nitride may include $Si_3N_4$, and the silicon oxide may include $SiO_2$. The gap-fill material may include silicon oxide, such as a spin-on insulator (SOD). Furthermore, the gap-fill material may include silicon nitride. In this case, the silicon nitride may be gap-filled using silicon nitride used as a liner.

The trenches 54 are formed in the active regions 53 and the isolation regions 52 at the same time. The trench 54 may be formed deeper in the isolation region 52 than in the active region 53 because of a difference between the etch rates of the active region 53 and the isolation region 52.

Prior to the formation of the burial gate electrodes 56, a gate insulation layer 55 may be formed over surfaces of the trenches 54. The burial gate electrodes 56 are formed by forming a metal containing layer so that the trenches 54 are gap-filled and then performing an etch-back. The metal-containing layer may include a material including metal, such as titanium (Ti), tantalum (Ta), or tungsten (W), as a major ingredient. The metal-containing layer may include any one selected from the group consisting of tantalum nitride (TaN), titanium nitride (TiN), tungsten nitride (WN), and tungsten (W). For example, the burial gate electrode 56 may include TiN, TaN, or W solely or may have a dual-layer layer, such as TiN/W or TaN/W in which W is stacked on TiN or TaN. Furthermore, the burial gate electrode 56 may include a dual-layer layer, such WN/W in which W is stacked on WN. In addition, the burial gate electrode 56 may include a metal material having low resistance.

A sealing layer 57 is formed over the burial gate electrodes 56. The sealing layer 57 may gap-fill the trenches 54 on the burial gate electrodes 56. The sealing layer 57 may function to protect the burial gate electrode 56 in a subsequent process. The sealing layer 57 may include an insulating material. The sealing layer 57 may include silicon nitride.

After forming the first interlayer insulation layer 58, bit line contact holes 59 are formed by etching the first interlayer insulation layer 58 and the sealing layer 57. The bit line contact plugs 60 are formed by forming a conductive layer in the bit line contact holes 59. Bit line structures, each including the bit line 61 and a bit line hard mask layer 62, are formed over the respective bit line contact plugs 60. The bit line contact plug 60 may include a polysilicon layer or a metal-containing layer. The bit line 61 may include a tungsten layer and may include a barrier layer, such as Ti/TiN, and a tungsten layer on the barrier layer. The bit line hard mask layer 62 may include silicon nitride.

Spacers 63 are formed over both sidewalls of each of the bit line structures. Next, after forming a second interlayer insulation layer 64, storage node contact holes 65 are formed by etching the second interlayer insulation layer 64, the first interlayer insulation layer 58, and the sealing layer 57. After forming sacrificial spacers (not shown) on the sidewalls of the storage node contact holes 65, the first plugs 66 recessed in the storage node contact holes 65 are formed. The air gaps 67 are formed by removing the sacrificial spacers.

Next, the capping layers 68 are formed by oxidizing the surfaces of the first plugs 66, and the capping layers 68 are selectively removed so that the surfaces of the first plugs 66 are exposed. This process may be performed after an etch-back process for forming the passivation layers 69. The air gaps 67 are capped with the respective capping layers 68. The passivation layer 69 protects the capping layer 68.

After forming the ohmic contact layers 70 on the first plugs 66 by using metal silicide, the second plugs 71 are formed over the respective ohmic contact layers 70. The second plug 71 may include a metal-containing layer. The second plug 71 may include a tungsten layer. Although not shown, the second plug 71 may further include a barrier layer. Accordingly, the second plug 71 may have a stack structure including the barrier layer and the metal-containing layer. The barrier layer may include a material including titanium (Ti). The barrier layer may be made of titanium (Ti) solely or may be formed by stacking titanium (Ti) and titanium nitride (TiN).

The storage node 72 of a capacitor is formed over the second plug 71. The storage node 72 may have a cylinder type and may have a pillar type in other embodiments. Although not shown, a dielectric layer and a plate node may be further formed over the storage node 72.

The semiconductor device according to the aforementioned embodiments may be applied to dynamic random access memory (DRAM), but is not limited thereto. The semiconductor device may be applied to static random access memory (SRAM), flash memory, ferroelectric random access memory (FeRAM), magnetic random access memory (MRAM), and phase change random access memory (PRAM), for example.

Figure 5:
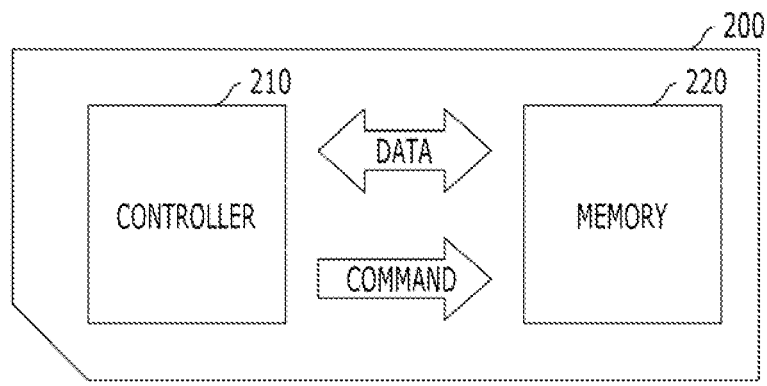
FIG. 5 is a schematic diagram of a memory card.

FIG. 5 is a schematic diagram of a memory card.

Referring to FIG. 5, the memory card 200 may include a controller 210 and memory 220. The controller 210 and the memory 220 may exchange electric signals. For example, the memory 220 and the controller 210 may exchange data in response to an instruction from the controller 210. Accordingly, the memory card 200 may store data in the memory 220 or externally output data from the memory 220. The memory 220 may include air gaps and plugs, such as those described above. The memory card 200 may be used as a variety of data storage media for a variety of handheld devices. For example, the memory card 200 may include a memory stick card, a smart media (SM) card, a secure digital (SD) card, a mini-secure digital (mini SD) card, or a multi-media card (MMC), etc.

Figure 6:
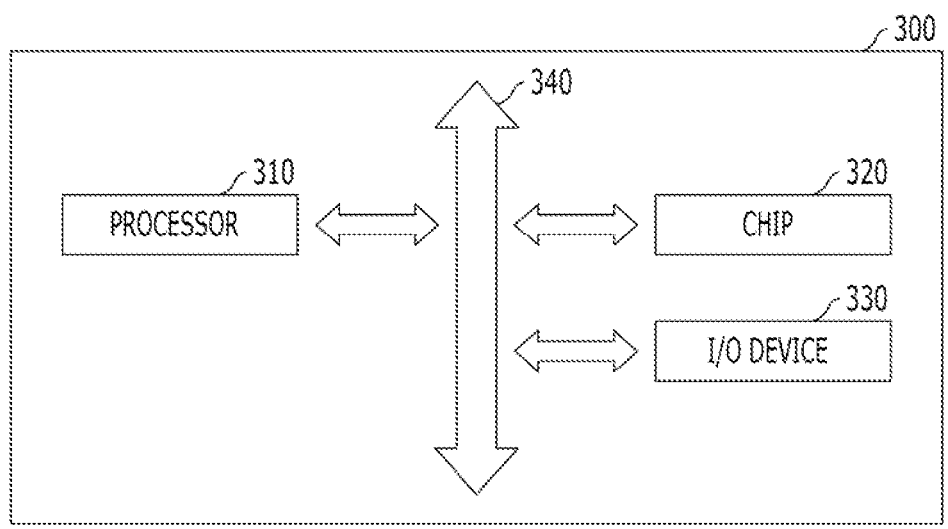
FIG. 6 is a block diagram of an electronic system.

FIG. 6 is a block diagram of an electronic system.

Referring to FIG. 6, the electronic system 300 may include a processor 310, an I/O device 330, and a chip 320. The processor 310, the I/O device 330, and the chip 320 may communicate data with each other by using a bus 340. The processor 310 may function to execute a program and control the electronic system 300. The I/O device 330 may be used to input or output the data of the electronic system 300. The electronic system 300 may be connected to an external device, for example, a personal computer or a network through the I/O device 330 and may exchange data with the external device. The chip 320 may store a code and data for the operation of the processor 310 and process part of an operation assigned by the processor 310. For example, the chip 320 may include air gaps and plugs, such as those described above. The electronic system 300 may form a variety of electronic control devices that require the chip 320. For example, the electronic system 300 may be used in mobile phones, MP3 players, navigators, solid state disks (SSDs), and household appliances.

This technology has an advantage in that it may reduce parasitic capacitance due to the air gap having a low dielectric constant because the air gap is formed between the conductive structures.

Furthermore, this technology is advantageous in that the air gap may be prevented from being opened in a subsequent process because the passivation layer is formed over the capping layer that caps the air gap and thus the air gap may be stably capped.

While the present invention has been described with respect to the specific embodiments, it will be apparent to those skilled in the art that various changes and modifications may be made without departing from the spirit and scope of the invention as defined in the following claims.

What is claimed is:

1. A method of fabricating a semiconductor device, comprising:
   forming a plurality of bit line structures over a substrate;
   forming contact holes between the bit line structures;
   forming sacrificial spacers over sidewalls of the contact holes;
   forming first plugs recessed into the respective contact holes;
   forming air gaps by removing the sacrificial spacers;
   forming capping structures entirely capping the air gaps while exposing top surfaces of the first plugs; and
   forming second plugs over the first plugs,
   wherein the capping structures are formed after the air gaps are formed,
   wherein the forming of capping structures comprises:
      forming capping layers over the top surfaces and sidewalls of the first plugs;
      forming a passivation layer over the entire surface in which the capping layers are formed; and
      selectively removing the capping layers and the passivation layer to form the capping structures having capping layer patterns and passivation layer patterns while exposing the top surfaces of the first plugs.

2. The method of claim 1, wherein the selectively removing of the capping layers and the passivation layer comprises:
   selectively etching the passivation layer using the capping layers as an etch barrier to Rain the passivation layer patterns having a spacer type; and
   selectively etching the capping layers to form the capping layer patterns to expose the top surfaces of the first plugs.

3. The method of claim 1, wherein the forming of capping layers over the top surfaces and sidewalls of the first plugs comprises:
   performing a plasma oxidization process on the top surfaces of the first plugs.

4. The method of claim 1, wherein the first plugs comprise a silicon-containing layer.

5. The method of claim 1, wherein the second plugs comprise a metal-containing layer.

6. The method of claim 1, further comprising:
   forming spacers over the sidewalls of the bit line structures before the forming the contact holes.

7. The method of claim 1, wherein each of the capping structures comprises a capping layer and a passivation layer stacked over the capping layer.

8. A method of fabricating a semiconductor device, comprising:
   forming a plurality of bit line structures over a substrate;
   forming contact holes between the bit line structures;
   forming sacrificial spacers on sidewalls of the contact holes;
   forming silicon plugs recessed into the respective contact holes;
   forming air gaps by removing the sacrificial spacers;
   forming capping structures entirely capping the air gaps while exposing top surfaces of the silicon plugs;
   forming ohmic contact layers over the silicon plugs; and
   forming metal plugs over the ohmic contact layers,
   wherein the capping structures are formed after the air gaps are formed,
   wherein:
   each silicon plug comprises a polysilicon layer, and
   each capping layer pattern comprises silicon oxide generated by oxidizing a silicon plug corresponding thereto.

9. The method of claim 8, wherein the forming of capping structures comprises:
   performing a plasma oxidation process on the top surfaces of the silicon plugs;
   forming silicon nitride over an entire surface including the oxide; and
   selectively removing the oxide and the silicon nitride so that the top surfaces of the silicon plugs are exposed.

10. The method of claim 8, wherein the ohmic contact layers comprise cobalt silicide.

11. The method of claim 8, wherein the metal plugs comprise tungsten.

12. The method of claim 8, wherein the sacrificial spacers comprise titanium nitride.

13. The method of claim 8, further comprising:
   forming spacers on the sidewalls of the bit line structures before the forming the contact holes.

14. The method of claim 8, wherein each of the capping structures comprises a capping layer and a passivation layer stacked over the capping layer.

* * * * *